(12) United States Patent
Negoro et al.

(10) Patent No.: US 9,362,328 B2
(45) Date of Patent: Jun. 7, 2016

(54) SEMICONDUCTOR DEVICE AND IMAGING APPARATUS

(71) Applicants: Takaaki Negoro, Kishiwada (JP); Hirofumi Watanabe, Miki (JP); Yutaka Hayashi, Tsukuba (JP); Toshitaka Ota, Tsukuba (JP); Yasushi Nagamune, Tsukuba (JP)

(72) Inventors: Takaaki Negoro, Kishiwada (JP); Hirofumi Watanabe, Miki (JP); Yutaka Hayashi, Tsukuba (JP); Toshitaka Ota, Tsukuba (JP); Yasushi Nagamune, Tsukuba (JP)

(73) Assignees: National Institute of Advanced Industrial Science and Technology, Tokyo (JP); RICOH COMPANY, LTD., Tokyo (JP)

( * ) Notice: Subject to any disclaimer, the term of this patent is extended or adjusted under 35 U.S.C. 154(b) by 394 days.

(21) Appl. No.: 13/793,445

(22) Filed: Mar. 11, 2013

(65) Prior Publication Data

US 2013/0234277 A1    Sep. 12, 2013

(30) Foreign Application Priority Data

Mar. 12, 2012   (JP) ................................ 2012-054240

(51) Int. Cl.
| | |
|---|---|
| *H01L 27/146* | (2006.01) |
| *H01L 29/73* | (2006.01) |
| *H01L 31/11* | (2006.01) |
| *H01L 29/739* | (2006.01) |

(52) U.S. Cl.
CPC .... *H01L 27/14681* (2013.01); *H01L 27/14683* (2013.01); *H01L 29/73* (2013.01); *H01L 31/1105* (2013.01); *H01L 29/739* (2013.01)

(58) Field of Classification Search
CPC ................ H01L 29/7395; H01L 29/73; H01L 29/14681; H01L 29/732
See application file for complete search history.

(56) References Cited

U.S. PATENT DOCUMENTS

| | | |
|---|---|---|
| 4,723,170 A | 2/1988 | Jaspers |
| 5,245,203 A | 9/1993 | Morishita et al. |

(Continued)

FOREIGN PATENT DOCUMENTS

| | | |
|---|---|---|
| JP | S48-38677 | 6/1973 |
| JP | S61-129858 | 6/1986 |

(Continued)

OTHER PUBLICATIONS

Japanese official action dated Dec. 22, 2015 in corresponding Japanese Patent Application No. 2012-054240.

*Primary Examiner* — Whitney T Moore
(74) *Attorney, Agent, or Firm* — Cooper & Dunham LLP

(57) ABSTRACT

The invention relates to a semiconductor device having a vertical transistor bipolar structure of emitter, base, and collector formed in this order from a semiconductor substrate surface in a depth direction. The semiconductor device includes an electrode embedded from the semiconductor substrate surface into the inside and insulated by an oxide film. In the surface of the substrate, a first-conductivity-type first semiconductor region, a second-conductivity-type second semiconductor region, and a first-conductivity-type third semiconductor region are arranged, from the surface side, inside a semiconductor device region surrounded by the electrode and along the electrode with the oxide film interposed therebetween, the second semiconductor region located below the first semiconductor region, the third semiconductor region located below the second semiconductor region. The electrode is insulated from the first to third semiconductor regions, and current gain is variable through application of voltage to the electrode.

20 Claims, 16 Drawing Sheets

(56) References Cited

U.S. PATENT DOCUMENTS

| | | | |
|---|---|---|---|
| 5,283,428 A | 2/1994 | Morishita et al. | |
| 5,352,920 A | 10/1994 | Morishita et al. | |
| 5,500,550 A | 3/1996 | Morishita | |
| 2005/0231129 A1* | 10/2005 | Chu et al. | 315/241 P |
| 2007/0292074 A1* | 12/2007 | Mazzola | 385/14 |
| 2008/0217699 A1* | 9/2008 | Disney | H01L 21/761 257/378 |
| 2009/0020852 A1* | 1/2009 | Harada | 257/579 |
| 2010/0101960 A1* | 4/2010 | Ohta | B82Y 20/00 204/643 |
| 2013/0092981 A1* | 4/2013 | Han et al. | 257/197 |

FOREIGN PATENT DOCUMENTS

| | | |
|---|---|---|
| JP | S61-154281 | 7/1986 |
| JP | S61-260674 | 11/1986 |
| JP | S61-283282 | 12/1986 |
| JP | H3-185879 | 8/1991 |
| JP | H5-30427 | 2/1993 |
| JP | 3071161 | 5/2000 |
| JP | 2010-225797 | 10/2010 |

* cited by examiner

FIG.7A
PHOTOTRANSISTOR REGION (1)
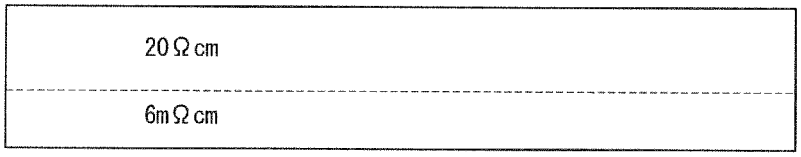
THERMAL DIFFUSION (Pwell, Nwell) (2)
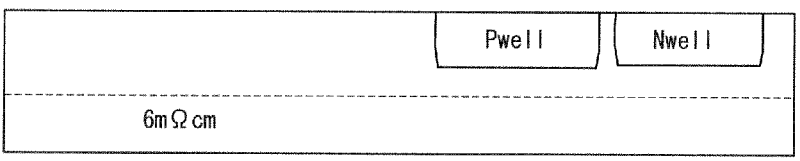
THERMAL DIFFUSION (BASE) (3)
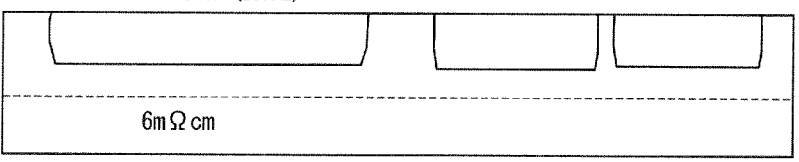
SILICON ETCHING (4)
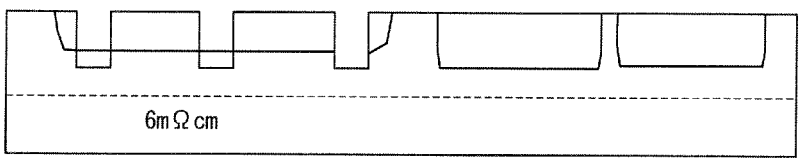
OXIDATION +
POLYSILICON EMBEDMENT + (5)
ETCH-BACK
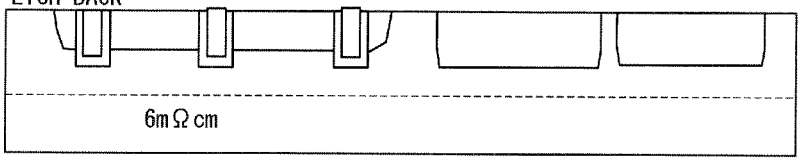

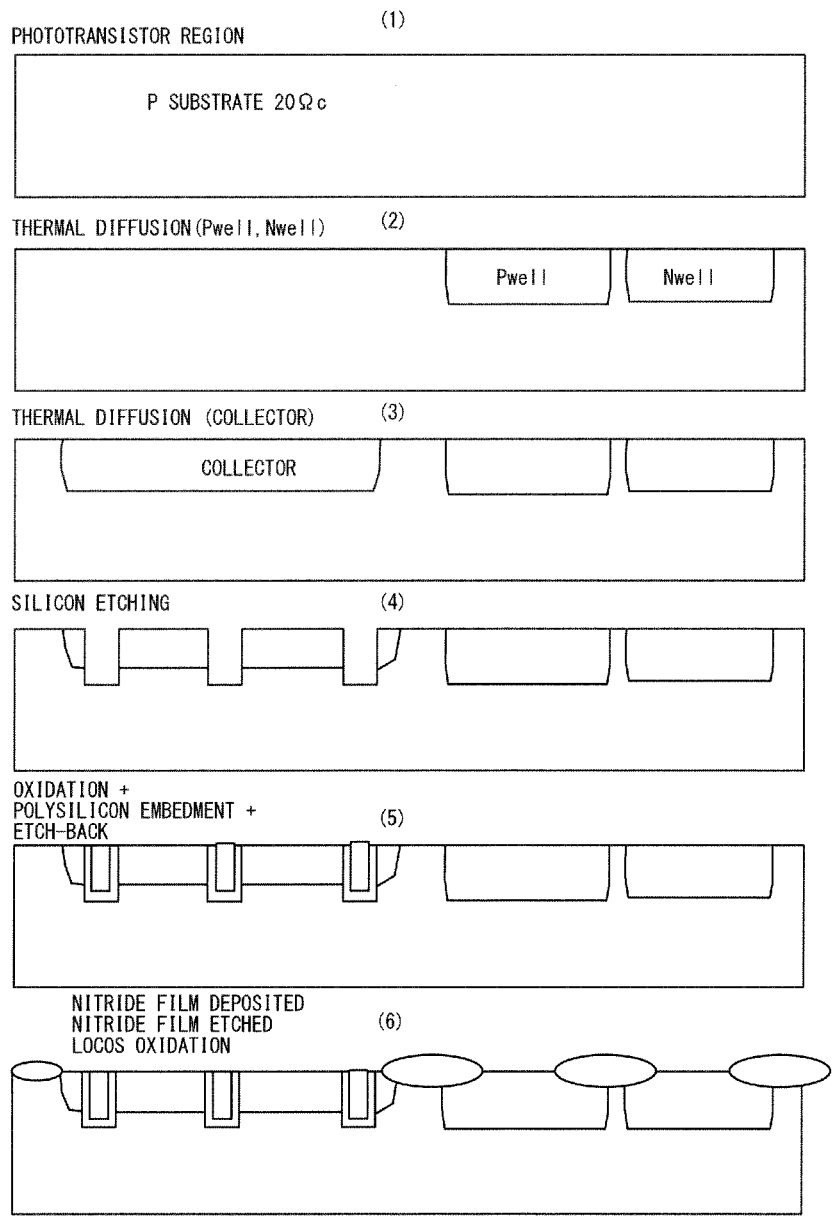

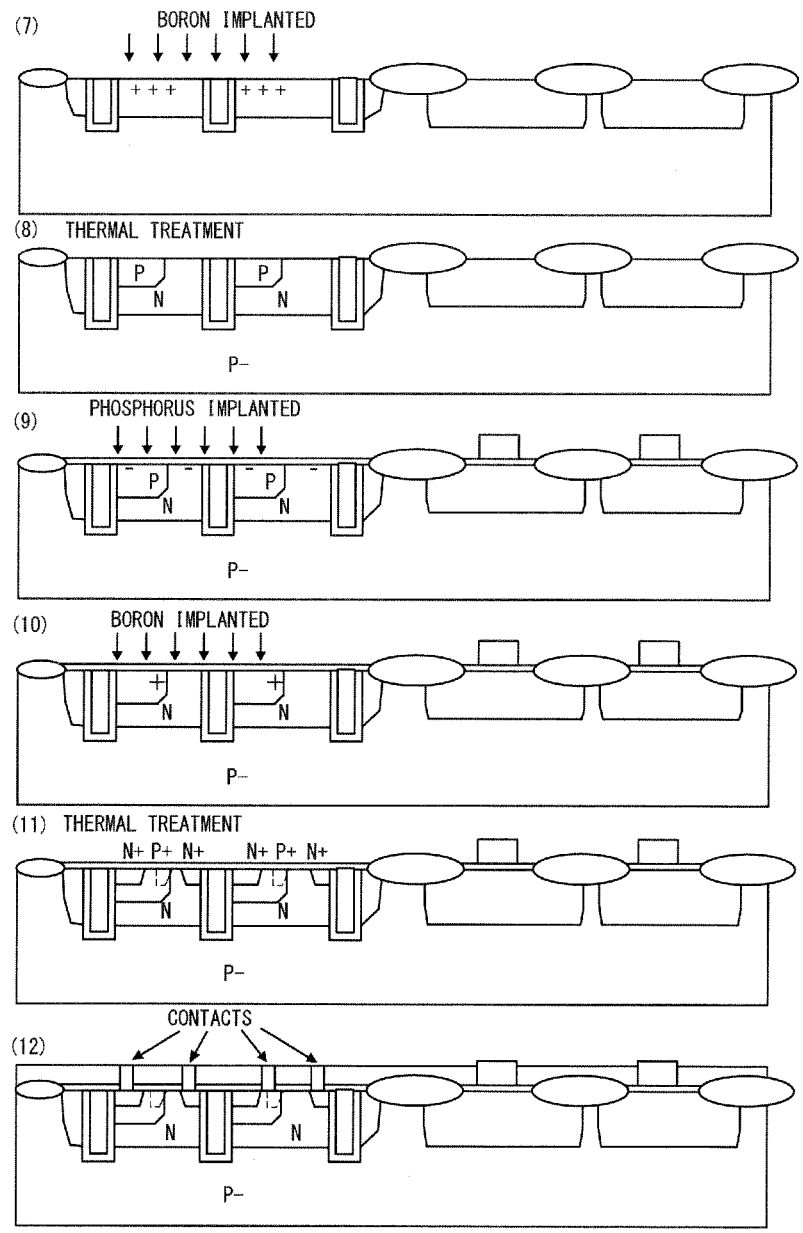

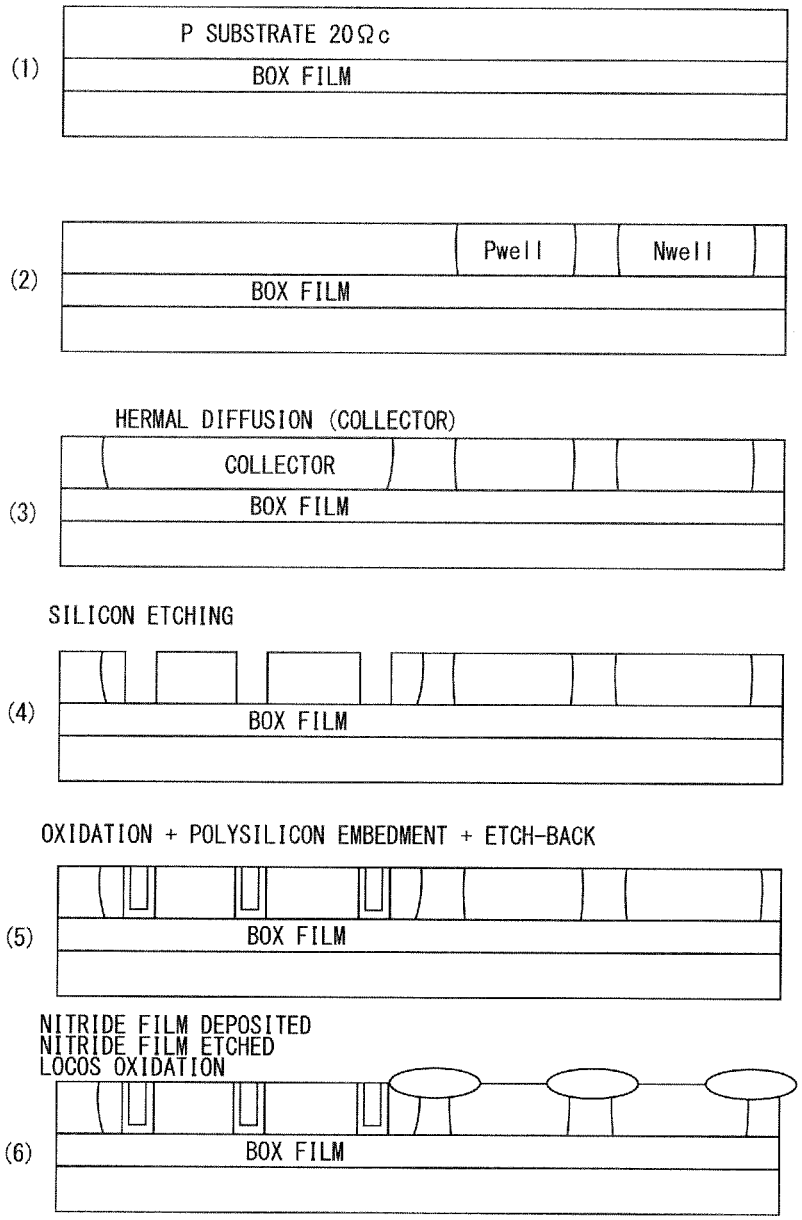

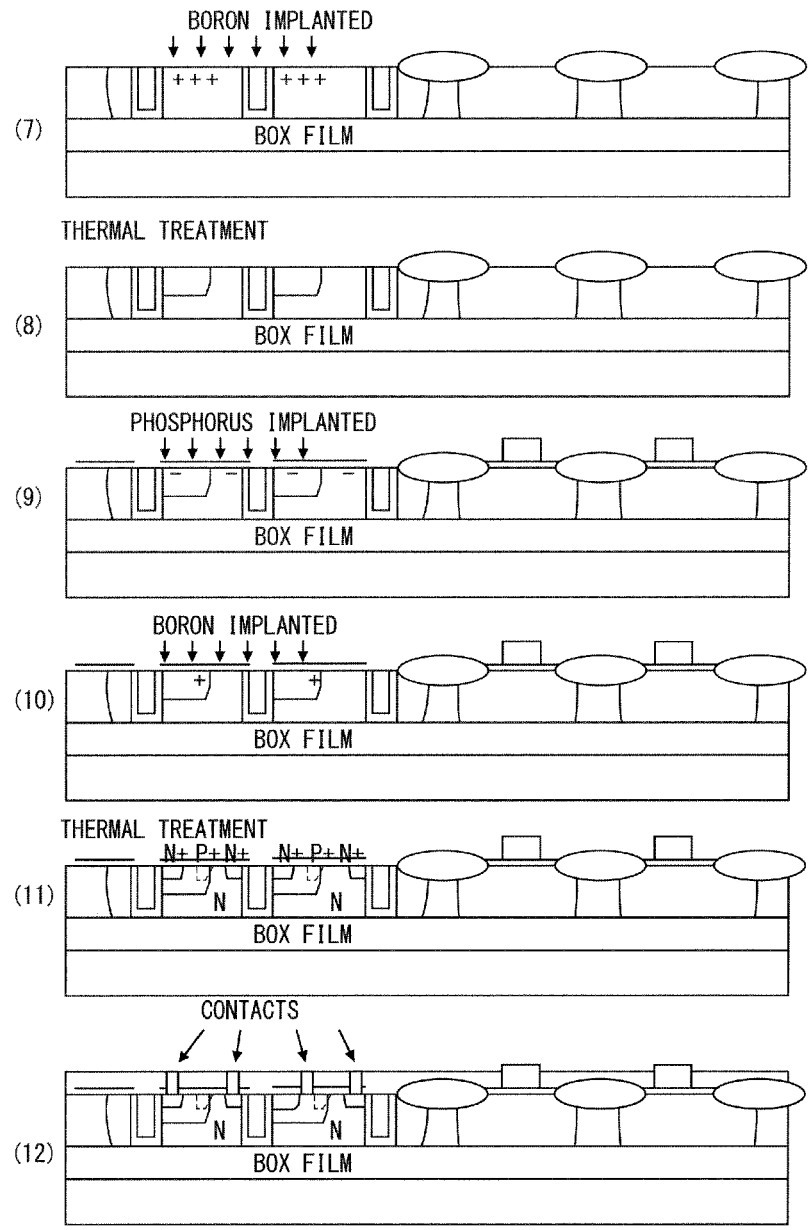

SEMICONDUCTOR DEVICE AND IMAGING APPARATUS

CROSS-REFERENCE TO RELATED APPLICATIONS

The present application is based on and claims priority from Japanese Patent Application Number 2012-054240, filed Mar. 12, 2012, the disclosure of which is(are) hereby incorporated by reference herein in its entirety.

BACKGROUND

The present invention relates to a semiconductor device such as a phototransistor configured to output a photocurrent upon light irradiation and also relates to an imaging apparatus using the semiconductor device.

A photodiode is often used as a photodetector since it can be manufactured by a simple process and can output photocurrent with constant sensitivity. However, since photocurrent obtained by light irradiation is weak, the photodiode has to have a large light-receiving area in order to have better light sensitivity under a low illuminance. A phototransistor having a bipolar transistor structure is characterized by its capability of, using the property of its bipolar transistor structure, amplifying photocurrent obtained by a collector-base photodiode before outputting it from an emitter or a collector of the phototransistor. To utilize this characteristic, a phototransistor is used for an imaging apparatus to achieve improvement in sensitivity.

When the level of photocurrent amplification is increased using the phototransistor, a large output signal can be obtained with a low illuminance, facilitating signal processing. The higher the illuminance, the larger the output current becomes. However, in a case where phototransistors are arranged in an array in an imaging apparatus, when the amount of current is large, resistance at a pixel address selector becomes problematic to make it difficult to accurately read a signal. As a result, it has been impossible to increase the gain and to increase the dynamic range of detectable light intensity at the same time. Moreover, special imaging and the like require partial correction of the brightness of an image. The partial correction of the brightness of an image is implemented by software processing. However, in software processing, when signal output cannot be obtained in real time, a delay occurs for the period of time for information processing. Furthermore, the amount of information obtained is limited because the dynamic range of the phototransistor is limited. Accordingly, what is needed is an imaging element capable of varying the current gain of a phototransistor and thereby varying the level of obtained photocurrent according to the light intensity.

Japanese Patent Application Publication No. 2010-225797 (referred to as Patent Document 1 below) discloses an example of a transistor structure capable of varying the current gain. This is achieved by making a lateral double-diffused MOS structure operate in a bipolar transistor manner (see FIG. 1). In the example illustrated in FIG. 1, a collector 3 made of an N-type diffusion layer, a base 5 made of a P-type diffusion layer, and an emitter 7 made of an N-type diffusion layer are formed in a P-type semiconductor layer 1, to form a bipolar transistor. The bipolar transistor is provided with a gate electrode 11 opposing the base 5 and the collector 3 with a gate insulation film 9 interposed between the gate electrode 11 and surfaces of the base 5 and the collector 3. The collector 3 is connected with collector wiring 13. The base 5 is connected with base wiring 15. The emitter 7 is connected with emitter wiring 17. The gate electrode 11 is connected with gate electrode wiring 19. The wiring 13, 15, 17, and 19 are electrically insulated with each other. Additionally, this document also shows how the current gain varies through application of voltage to a gate electrode (see FIG. 2). Refer also to Japanese Patent No. 3071161.

The inventor of the present invention focused on the fact that a transistor having a structure capable of varying its current gain can operate as a phototransistor by using photocurrent obtained by light irradiation as a base current. In other words, by varying the level of voltage applied to the gate electrode, the current gain can be varied likewise for photocurrent amplification.

However, to improve resolution which determines image quality, the larger the light-receiving cell, the better. A phototransistor having a bipolar transistor structure has diffusion regions of emitter, base, and collector from the semiconductor surface in its depth direction. When used in an imaging apparatus, each phototransistor can be operated with common collector, but has to have isolated base. Since base diffusion spreads laterally, cells have to be located away from each other. In array arrangement, reducing the area of the array is difficult because enough space has to be secured between base diffusion regions.

In addition, since the regions of the bipolar transistor which are used to make the current gain is variable is only portions opposed to the gate electrode and is therefore of small area, only a limited effect can be obtained. Further, being located on this bipolar transistor region, the gate electrode hinders incidence of light.

SUMMARY

An objective of the present invention is to provide a semiconductor device having a small sized cell and improved light use efficiency and to also provide an imaging apparatus using the semiconductor device.

The present invention offers the following techniques to solve the above problems:

(1) A semiconductor device having a vertical bipolar transistor structure in which an emitter region, a base region, and a collector region are formed in this order from a surface of a semiconductor substrate in a depth direction, the semiconductor device further comprising an electrode embedded from the surface of the semiconductor substrate into an inside of the semiconductor substrate, and insulated by an oxide film. In the surface of the substrate, the semiconductor device has a structure in which a first semiconductor region of a first conductivity type, a second semiconductor region of a second conductivity type, and a third semiconductor region of the first conductivity type are arranged, from the surface side, inside a semiconductor device region surrounded by the electrode and along the electrode with the oxide film interposed therebetween, the second semiconductor region being located below the first semiconductor region and having a side surface, the third semiconductor region being located below the second semiconductor region, the electrode being opposed via the oxide film to the side surface of the second semiconductor region. The electrode is insulated from the first semiconductor region, the second semiconductor region, and the third semiconductor region by the oxide film, and a current gain is variable through application of voltage to the electrode.

(2) A semiconductor device having a vertical bipolar transistor structure in which an emitter region, a base region, and a collector region are formed in this order from a surface of a semiconductor substrate in a depth direction, the semiconductor device further comprising an electrode embedded from the surface of the semiconductor substrate into an inside of the semiconductor substrate, and insulated by an oxide film. In the surface of the substrate, the semiconductor device has a structure in which a first semiconductor region of a first conductivity type, a second semiconductor region of a second conductivity type, and a third semiconductor region of the first conductivity type are arranged, from the surface side, inside a semiconductor device region surrounded by the electrode and along the electrode with the oxide film interposed therebetween, the second semiconductor region being located below the first semiconductor region and having a side surface, the third semiconductor region being located below the second semiconductor region, the electrode being opposed via the oxide film to the side surface of the second semiconductor region. An impurity distribution profile of the second semiconductor region is oblique such that an impurity concentration of the second semiconductor region is lower on the third semiconductor region side than on the first semiconductor region side. The electrode is insulated from the first semiconductor region, the second semiconductor region, and the third semiconductor region by the oxide film, and a current gain is variable through application of voltage to the electrode.

(3) In the semiconductor device according to (1) or (2), the first semiconductor region on the surface side is spaced apart from the electrode, and a part of the second semiconductor region is located in the surface and interposes between the first semiconductor region and the electrode.

(4) A semiconductor device having a vertical bipolar transistor structure in which an emitter region, a base region, and a collector region are formed in this order from a surface of a semiconductor substrate in a depth direction, the semiconductor device further comprising an electrode embedded from the surface of the semiconductor substrate into an inside of the semiconductor substrate, and insulated by an oxide film. In the surface of the substrate, the semiconductor device has a structure in which a first semiconductor region of a first conductivity type, a second semiconductor region of a second conductivity type, a third semiconductor region of the first conductivity type, and a fourth semiconductor region of the second conductivity type are arranged, from the surface side, inside a semiconductor device region surrounded by the electrode and along the electrode with the oxide film interposed therebetween, the second semiconductor region being located below the first semiconductor region and having a side surface, the third semiconductor region being located below the second semiconductor region, the fourth semiconductor region being located below the third semiconductor region, the electrode being opposed via the oxide film to the side surface of the second semiconductor region. The electrode is insulated from the first semiconductor region, the second semiconductor region, the third semiconductor region, and the fourth semiconductor region by the oxide film, and a current gain is variable through application of voltage to the electrode.

(5) A semiconductor device having a vertical bipolar transistor structure in which an emitter region, a base region, and a collector region are formed in this order from a surface of a semiconductor substrate in a depth direction, the semiconductor device further comprising an electrode embedded from the surface of the semiconductor substrate, which is an SOI (Silicon On Insulator) substrate, into an inside of the semiconductor substrate, and insulated by an oxide film. In the surface of the substrate, the semiconductor device has a structure in which a first semiconductor region of a first conductivity type, a second semiconductor region of a second conductivity type, and a third semiconductor region of the first conductivity type, from the surface side, inside a semiconductor device region surrounded by the electrode and along the electrode with the oxide film interposed therebetween, the second semiconductor region being located below the first semiconductor region and having a side surface, the third semiconductor region being located below the second semiconductor region, the electrode being opposed via the oxide film to the side surface of the second semiconductor region, the structure having a BOX (Buried Oxide) film formed below the third semiconductor region and in contact with the oxide film. The electrode is insulated from the first semiconductor region, the second semiconductor region, and the third semiconductor region by the oxide film, and a current gain is variable through application of voltage to the electrode.

(6) An imaging apparatus comprising the semiconductor device of any one of (1) to (5). The semiconductor device operates as a phototransistor, and a plurality of the semiconductor devises are two-dimensionally arranged.

(7) The imaging apparatus according to (6), further comprising a comparator circuit configured to monitor a photocurrent outputted by light irradiation or a voltage obtained by converting the photocurrent, and to control, based on a result of the monitoring, voltage applied to the electrode.

According to the configuration of (1), a portion sectioned by the embedded electrode serves as a light-receiving cell, and the base region can be insulated and isolated by the embedded electrode. Accordingly, a layout can be created without having to consider the lateral spreading of the base region, and therefore the area of the cell can be reduced. In addition, being embedded in the silicon substrate, the electrode does not hinder incidence of light. Through application of voltage to the embedded electrode, the current gain of the phototransistor having a vertical bipolar transistor structure can be varied.

According to the configuration of (2), since the impurity distribution profile of the base region is oblique, the base region is affected by the electric filed from the electrode not only near the electrode but also in its inside. Thus, the current gain can be varied largely.

According to the configuration of (3), the emitter diffusion and the embedded electrode are away from each other, and therefore, varying the current gain through application of voltage to the embedded electrode described in (1) above can be mitigated.

According to the configuration of (4), the base and collector regions are each isolated by the embedded electrode. Accordingly, a collector voltage can be applied, which expands the degree of freedom in circuit design.

According to the configuration of (5), an SOI substrate is used, and the phototransistors are completely insulated and isolated from each other. Accordingly, electric charges generated by light irradiation do not travel around to other phototransistors. This can prevent mixture of color when they are arranged in an array.

According to the configuration of (6), a large-area phototransistor formed by two-dimensionally arranging phototransistor sections having the embedded electrode can vary its current gain.

According to the configuration of (7), the imaging element itself has a capability of photocurrent amplification, and thus the current gain is variable. Accordingly, the imaging apparatus can be improved in its imaging sensitivity for light irradiation and its dynamic range.

BRIEF DESCRIPTION OF THE DRAWINGS

FIG. 7A is a diagram illustrating an example of a method of manufacturing the common-collector phototransistor shown in FIGS. 3A to 3C.

FIG. 8A is a diagram illustrating an example of a method of manufacturing the isolated-collector phototransistor shown in FIGS. 5A to 5C.

FIG. 8B is a diagram illustrating the example of the method of manufacturing the isolated-collector phototransistor shown in FIGS. 5A to 5C.

FIG. 9A is a diagram illustrating an example of a method of manufacturing the phototransistor shown in FIG. 6 using an SOI substrate.

FIG. 9B is a diagram illustrating the example of the method of manufacturing the phototransistor shown in FIG. 6 using an SOI substrate.

DETAILED DESCRIPTION OF THE PREFERRED EMBODIMENTS

To solve the above-described problem of inhibition of light irradiation and to thereby improve light use efficiency, an electrode formed of polysilicon is embedded in a silicon substrate (referred to as an embedded electrode below).

Figure 3A:
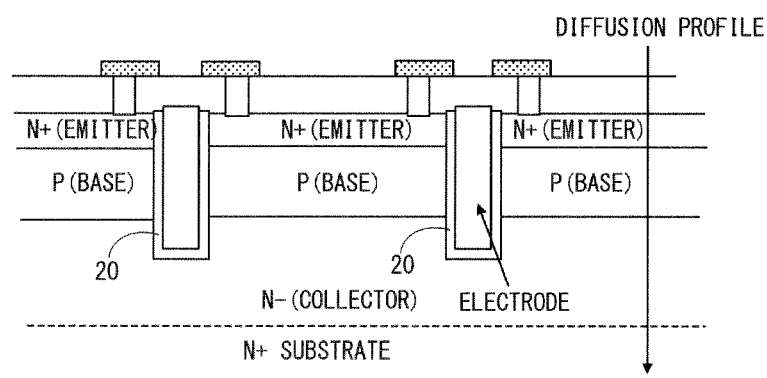
FIGS. 3A to 3C show an example of a phototransistor according to the present invention, FIG. 3A showing its sectional view, FIG. 3B showing its plan view, FIG. 3C showing a graph of an impurity distribution profile.
Figure 3B:
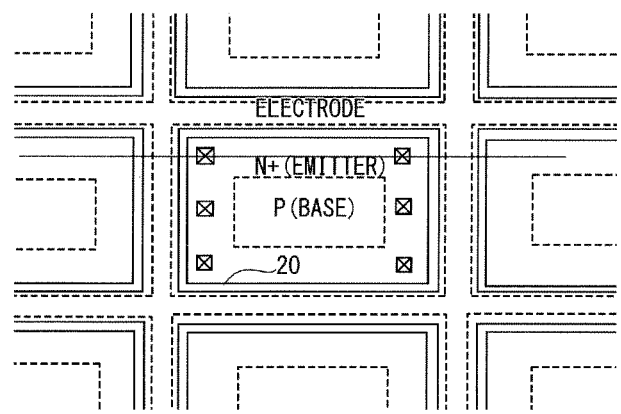
Figure 3C:
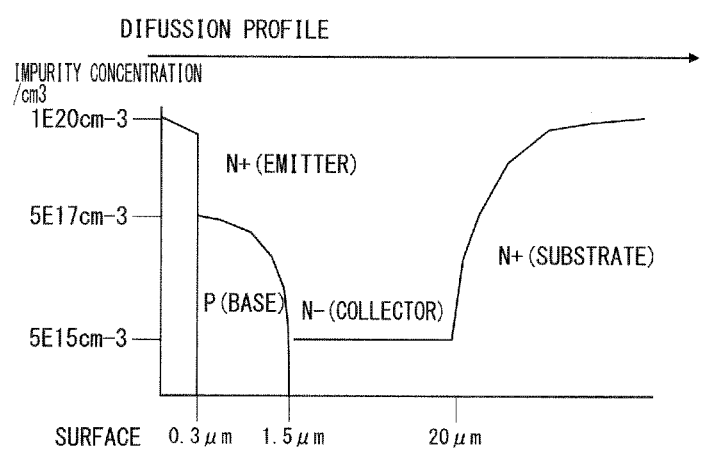

FIGS. 3A to 3C show an example of a phototransistor according to the present invention. Specifically, FIG. 3A is a sectional view, FIG. 3B is a plan view, and FIG. 3C is a graph showing an impurity diffusion profile. In this example, phototransistors are arranged in an array and have a common collector potential, and photocurrent is picked up from the emitter. Emitter diffusion and base diffusion are each isolated by the embedded electrode. The size of the element is determined by the size of a zone sectioned by the embedded electrode. Accordingly, the distance of lateral diffusion does not have to be taken into consideration, allowing size reduction of each element.

For example, a comparison is made to bipolar, diffusion transistors in which impurities are diffused directly under an oxide film and which are arranged in an array. If the base diffusion is 1.5 μm deep, the diffusion spreads laterally as well by about 1.2 μm. Since a collector region has to be formed between adjacent base diffusion regions, light-receiving cells need to be away from each other by about 4 μm. In contrast, the embedded electrode portion is formed by forming a groove of about 5 μm depth and 1 μm width using the trench etching technique and then by making polysilicon deposited and embedded in the groove using a CVD device. Accordingly, the inter-cell distance is determined by the width of the groove, and the width of lateral base diffusion does not have to be considered. As a result, the element size can be greatly reduced.

The embedded electrode is insulated and isolated from a first semiconductor region (emitter region) and a second semiconductor region (base region) by an electrically-insulating oxide film 20 (of 15 nm thickness). The embedded electrode is lowered in its resistance by N-type polysilicon having an impurity concentration of $10^{20}$ cm$^{-3}$ or higher. The emitter region, the base region, and the collector region (third semiconductor region) are in contact with the embedded electrode with the oxide film 20 interposed therebetween, and therefore have a vertical bipolar transistor structure. In a bipolar transistor, generally, an impurity distribution profile of the base region is oblique in such a manner as to have a high impurity concentration at the emitter side and a low impurity concentration at the collector side. Thereby, the frequency characteristic is improved by the electric field inside the base diffusion, and the current gain can be increased. Also in the structure of the present invention, in the phototransistor region sectioned by the embedded electrode, base impurity diffusion starts from the silicon surface and forms an oblique base region constituting a vertical bipolar transistor structure.

In the present invention, as shown in FIG. 3C, for example, the emitter region has a concentration of $10^{20}$ cm$^{-3}$, and the base region has a concentration of $5\times10^{17}$ cm$^{-3}$ immediately below the emitter diffusion and a concentration of $5\times10^{15}$ cm$^{-3}$ on the collector region side, and is thus oblique. When a voltage is applied to the embedded electrode, the phototransistor-constituting region around the electrode is affected by the electric field, and particularly the base region, which is a quasi-neutral region, varies its width. As a result, the current gain of the bipolar transistor can be varied. Further, since the impurity distribution profile of the base region is oblique such that its impurity concentration is high on the emitter-region side and is low on the collector-region side, a depletion layer generated in an area on the collector-region side in the base region easily spreads from the vicinity of the embedded electrode to the inside. Accordingly, compared with an even impurity distribution profile, the current gain can be varied largely.

Figure 1:
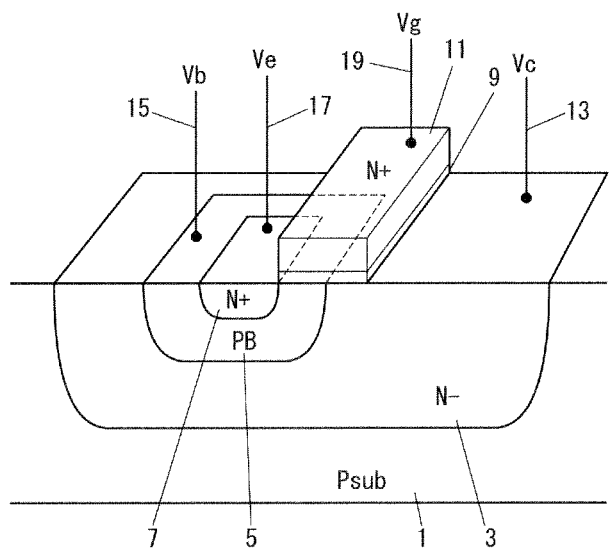
FIG. 1 is a perspective view showing an example of a transistor structure of Patent Document 1.
Figure 2:
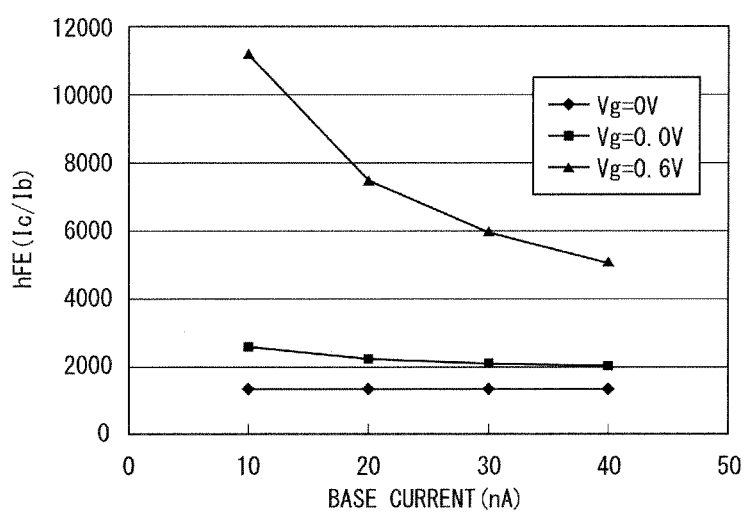
FIG. 2 is a graph showing how a current gain varies through application of voltage to an electrode of FIG. 1.

In the present invention, this current-gain varying region is a portion adjacent to the embedded electrode. By contrast, the effect of Patent Document 1 (Japanese Patent Application Publication No. 2010-225797) can be obtained for low current range. In the structure of Patent Document 1 (see FIG. 1), the vertical bipolar transistor region constituted by source, body, and drain regions is large, and the portion adjacent to the embedded electrode is limited to a portion in the silicon surface immediately below the electrode and therefore accounts for only a small percentage of the total area. Thus, a limited effect is obtained. In the present invention, the embedded electrode exists over the entire circumference of each cell, and by reducing the area of the cell, the ratio of the area of the vertical bipolar transistor structure adjacent to the embedded electrode can be increased. As a result, the current range for which the effect is obtainable can be expanded to the high current side.

Moreover, by two-dimensionally arranging many phototransistors which are sectioned by the embedded electrode and making them have common emitter and collector, a single phototransistor having a large area can be obtained. Such a large phototransistor can also provide the same effect as described above.

Figure 4A:
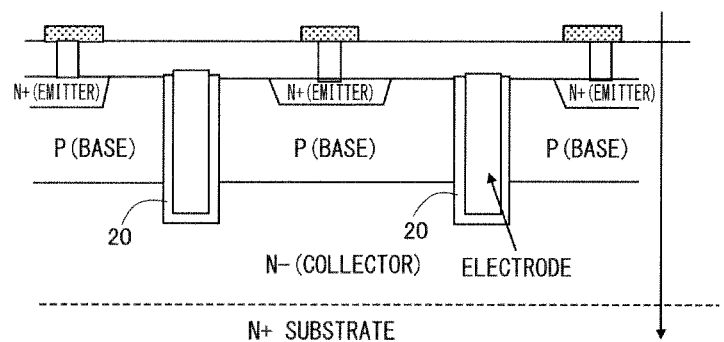
FIGS. 4A and 4B show another example of a phototransistor according to the present invention, FIG. 4A showing its sectional view, FIG. 4B showing its plan view.
Figure 4B:
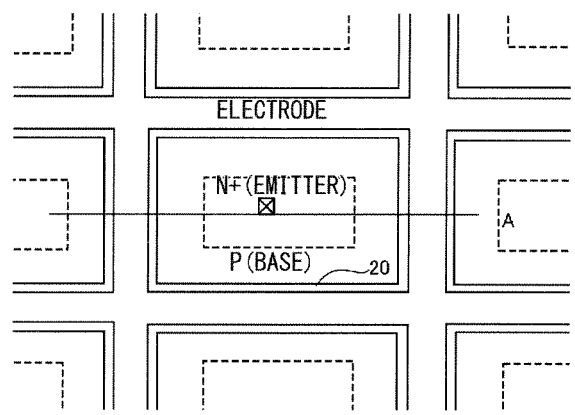

Further, in the structure example described above, since the emitter region is adjacent to the embedded electrode, both the emitter-base junction and the base-collector junction are affected by the electric field from the embedded electrode. When the variation in the current gain is too large, it can be mitigated by locating the emitter-base junction away from the embedded electrode, as shown in FIG. 4. In this case, when a voltage larger than a collector voltage is applied to the embedded electrode, the quasi-neutral base region near the electrode varies its width to allow a variation in the current gain, as described above. To make the effect greater, the impurity distribution profile of the base region should preferably be oblique.

Next, aside from the isolated-base structure, an example is shown of a collector-isolated structure.

FIG. 5 shows a structure in which an embedded electrode is embedded to such a depth, namely, into a P-type silicon substrate (fourth semiconductor region), which is described later, as to isolate the emitter region, the base region, and the collector region so that the collector can be isolated to allow application of voltage to each collector of phototransistors arranged in an array. Thereby, the collector potential and the emitter potential can be freely set for each of the phototransistors arranged in an array, and a signal can be selectively outputted from the emitter or the collector. Thus, a degree of freedom in circuit operation can be enhanced. Moreover, in such a case, since the collector and the emitter have to have their terminals on the surface to operate as a phototransistor, the emitter region, the base region, and the collector region are located in the silicon surface. Thus, there exist a vertical bipolar transistor structure in the diffusion depth direction as well as a lateral bipolar transistor structure on the surface side. The lateral bipolar transistor structure largely varies the current gain for a collector current; therefore, to suppress this behavior, base diffusion (P+ region) of a high concentration (of $10^{19}$ cm$^{-3}$ or higher) is formed in the surface of the base region at a position away from the emitter region by about 1 μm and in contact with the base region.

FIG. 6 shows a structure in which: an SOI (Silicon On Insulator) substrate is used; a BOX (Buried Oxide) film 21 of about 1 μm thickness is placed below collector diffusion; and an embedded electrode is embedded to reach the electrically-insulating BOX film 21. Thus, each phototransistor cell is completely insulated and isolated from its adjacent phototransistor cells, compared to the above structure having the common collector and the above structure in which the collector is in contact with the adjacent cells at the PN junction. As a result, electric charges generated by incidence of light are diffused only within each phototransistor, and does not move to its adjacent phototransistors. Thus, even when an imaging apparatus have phototransistors that are arranged in an array, color mixture among them can be prevented.

Figure 10:
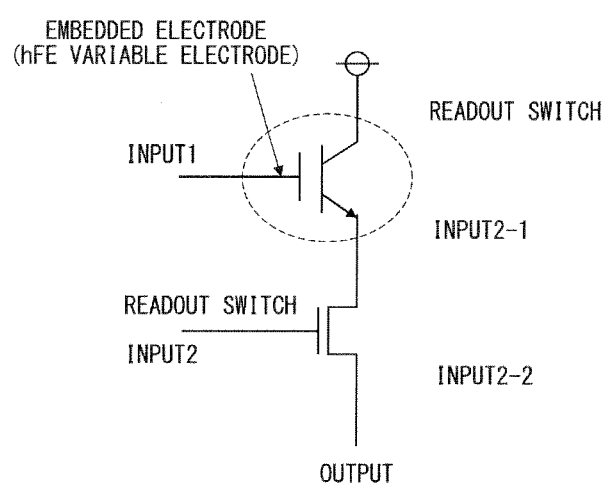
FIG. 10 is a circuit diagram showing an application in which the phototransistor of the present invention is used alone as an imaging element.

FIG. 10 shows an application in which the phototransistor of the present invention is used alone as an imaging element. A single imaging cell is configured by the phototransistor of the present invention and a MOS (Metal-Oxide Semiconductor) readout switch. While the imaging cell is irradiated with light with the MOS switch being off, electric charges are accumulated in the base region of the phototransistor. By turning the MOS switch on, an output current is picked up as a photocurrent after being amplified with the current gain of the phototransistor.

When only a small output current is obtained because of low intensity of light, a voltage which increases the current gain is applied to the embedded electrode (input 1) to increase the output current. Thereby, the sensitivity can be enhanced for the light intensity. Conversely, when an accurate output current cannot be obtained in time for cell selection because of high intensity of light which makes the electric output too large and the output current saturated, a voltage which decreases the current gain is applied to the embedded electrode (input 1) to lower the sensitivity for the light intensity. Thereby, an appropriate output current corresponding to the light intensity can be obtained.

Figure 11:
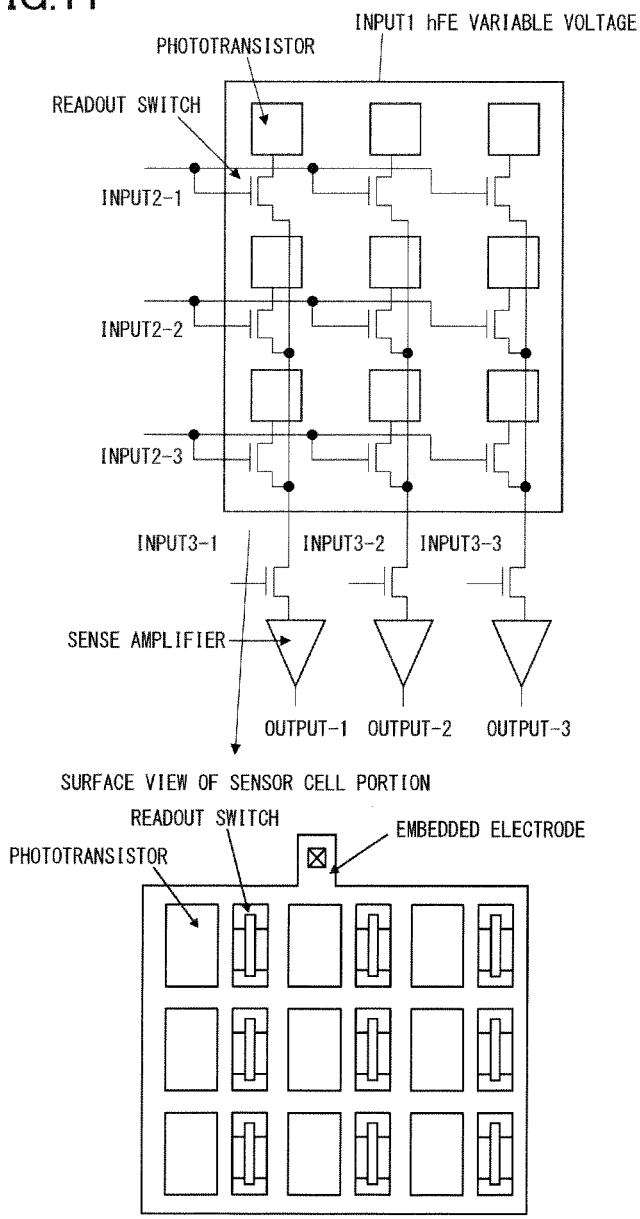
FIG. 11 is a block diagram showing an example of an imaging array having individual imaging cells arranged two-dimensionally.

FIG. 11 shows an example of an imaging array in which individual imaging cells are arranged two-dimensionally. This example shows a two-dimensional imaging apparatus which uses the MOS switch (input 2) of the single imaging cell of the above example as each readout switch and which additionally has MOS switches (input 3) for line selection. A two-dimensional image can be obtained by: causing a sense amplifier to amplify an output current from an array whose address is selected using the MOS switches (input 2 and input 3) at a constant frequency; and performing data processing.

In this example, the embedded electrode is common, and the current gain of the entire array is controlled with a single signal. Thus, the current gains of all the phototransistors can be varied collectively. The effect offered by this two-dimensional imaging apparatus is similar to that of the single cell described above and is as follows. Specifically, when the light intensity over the entire image is low to make the maximum signal level of an output current low, the current gain is increased to increase the overall output current. Conversely, when the light intensity is so high that the sensor cell cannot obtain an appropriate output signal or that the output current is saturated, the current gain is decreased to reduce the output current to an appropriate level.

Figure 12:
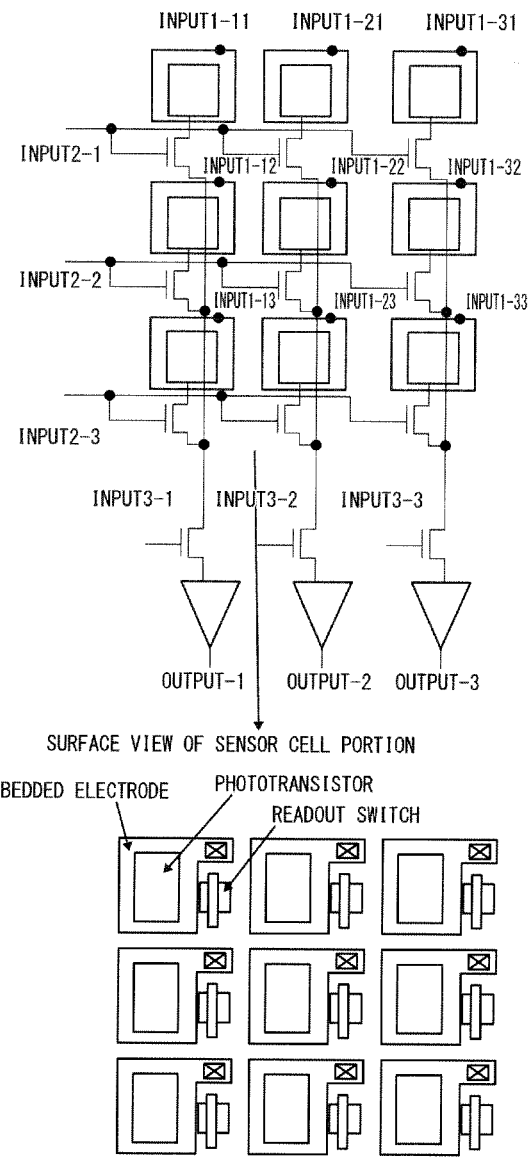
FIG. 12 is a block diagram showing an example of an imaging array in which each imaging element has an isolated embedded electrode of the phototransistor of the present invention.

FIG. 12 shows a structure in which phototransistors of the present invention are arranged in an array and have isolated embedded electrodes, respectively. In such a structure, imaging elements and voltage application to their embedded electrodes (such as from input 1-11 to input 1-33) can be freely selected and set. Accordingly, by sensing a location in an image which is too bright or too dark and giving feedback, the sensor cell performs correction on an output current to level the output current. Thus, the quality of the image can be improved. Further, in special imaging, for example, image contrast can be varied at a location to be emphasized.

Figure 13:
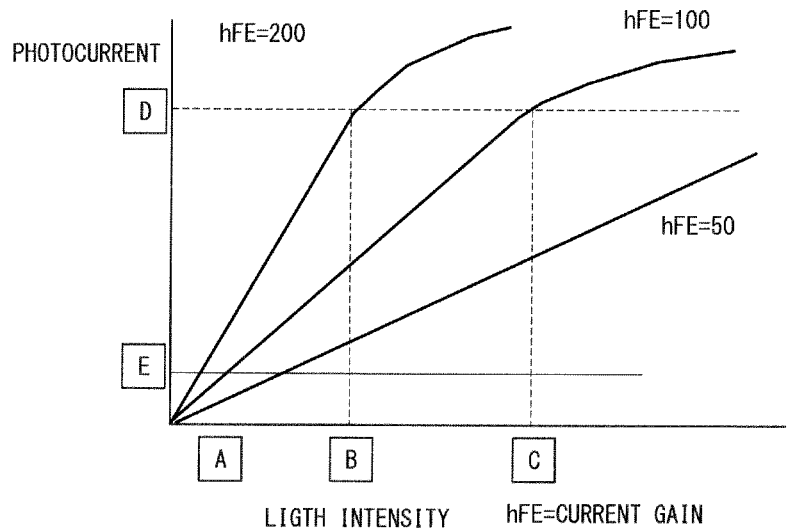
FIG. 13 is a graph showing relations between light intensity and photocurrent of phototransistors having the same cell size and different current gains.

An example is shown of a method of controlling the current gain through voltage application to the embedded electrodes, to obtain the effect described above. Phototransistors having the same cell size and different current gains have such relations between light intensity and photocurrent as shown in FIG. 13. The photocurrent increases almost proportional to the light intensity, and when it reaches photocurrent D where an electric output is too large, the phototransistor is driven into a high injection state. Then, the current gain degreases, and the photocurrent becomes saturated eventually.

For example, when a voltage applied to the embedded electrode is 0.2 V and an hFE is 100, the photocurrent exceeds D and becomes saturated at light intensity C. In this case, by varying the application voltage to 0 V, the photocurrent is outputted with an hFE of 50; thus, even at light intensity C, the proportional relation of the photocurrent recovers, or the saturation level is mitigated. Meanwhile, at light intensity A to light intensity B where the photocurrent per se is a small signal, by varying the application voltage to 0.4 V, the photocurrent is outputted with an hFE of 200. Thus, the photocurrent can be increased to a level obtainable at light intensity C. Accordingly, by monitoring a maximum value of an obtained photocurrent and giving feedback, based on the output level, as to a voltage to be applied to the embedded electrode, the photocurrent can be controlled not to exceed photocurrent D.

Figure 14:
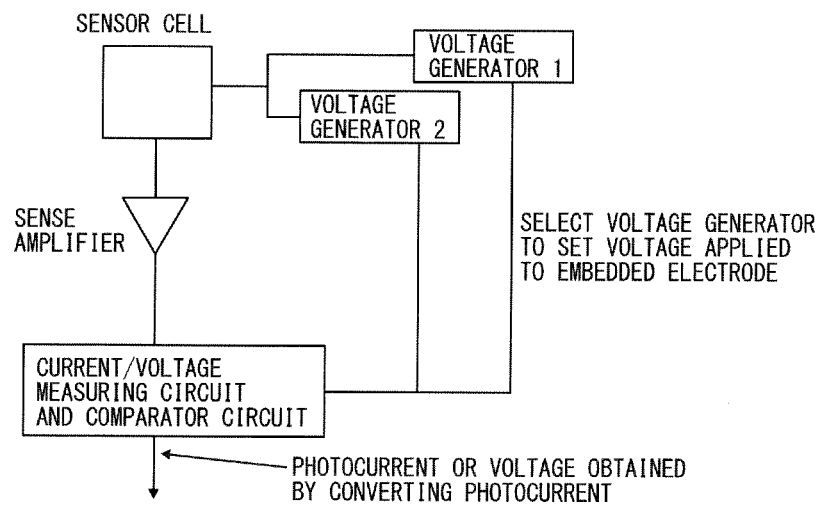
FIG. 14 is a functional block diagram showing an example of an imaging apparatus of the present invention.

FIG. 14 is a functional block diagram showing an example of an imaging apparatus of the present invention. A comparator circuit monitors maximum values of photocurrents, or voltages obtained by converting the photocurrents, outputted from many sensor cells (phototransistors). For example, Level E which is 1/10 of photocurrent D and Level D at which the photocurrent reaches photocurrent D are preset as output levels of photocurrent. When an actual photocurrent is lower than Level E, the comparator circuit selects a voltage generator 1 which quintuples the current gain. When an actual photocurrent exceeds Level D, the comparator circuit selects a voltage generator 2 which reduces the current gain to half. As a result, even the sensor cells receiving different light intensities can output signals that do not differ from each other much. In the above example, there are two output levels and two set voltages of the voltage generators. However, there may be three or more output levels and set voltages. The more the output levels and the set voltages, the more precisely the correction can be made.

With reference to the drawings, a manufacturing flow of the present invention is described below.

Figure 7B:
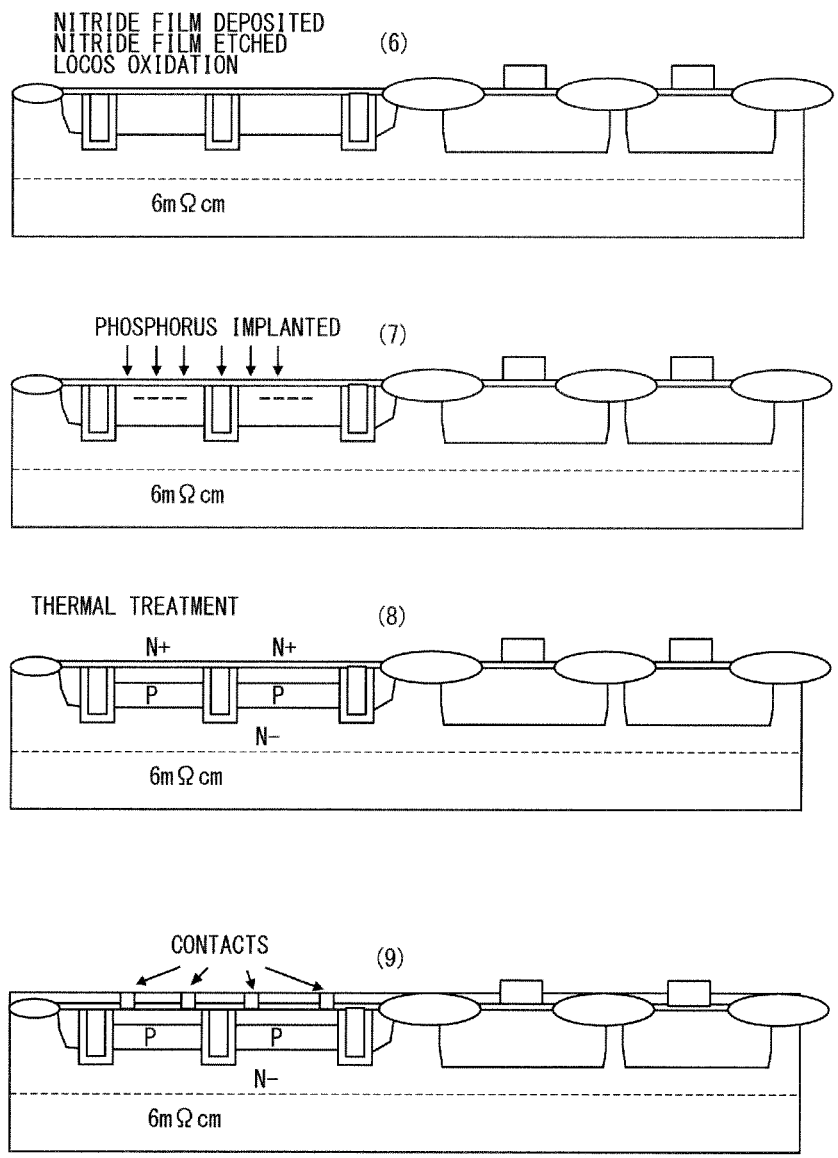
FIG. 7B is a diagram illustrating the example of the method of manufacturing the common-collector phototransistor shown in FIGS. 3A to 3C.

FIGS. 7A and 7B are diagrams illustrating an example of a method of manufacturing the common-collector phototransistor shown in FIGS. 3A to 3C.

(1) To form a collector electrode in a substrate, a high-concentration N+ diffusion (6 mΩcm) substrate is used to have low resistance, and an N− epitaxial layer (20 Ωcm) of about 20 μm thickness is formed on the substrate for device fabrication. The thickness of the epitaxial layer can be set freely according to the light absorptivity for the wavelength of a light source.

(2) A region for forming an MOS transistor is formed by implanting boron (50 KeV $5 \times 10^{12}$ cm$^{-2}$) as a p-well region and phosphorus (150 KeV $2 \times 10^{12}$ cm$^{-2}$) as an n-well and performing thermal diffusion under 1150° C. for 240 minutes. Since the phototransistor region is important for the present invention, the MOS region is simplified herein.

(3) A base diffusion region of about 1.5 μm depth is formed by implanting boron (50 KeV $5 \times 10^{13}$ cm$^{-2}$) as a base region and performing thermal treatment under 1120° C. for 90 minutes. The depth of the base diffusion is determined according to the light absorptivity for the wavelength of the light source, and the diffusion depth and concentration should be set to such values as to stabilize the current gain.

(4) For embodiment of an electrode, a groove of about 1 μm width and 5 μm depth is formed by silicon etching, the groove penetrating the base diffusion region and reaching the collector diffusion region.

(5) Thermal oxidation is performed to form an oxide film of about 20 nm thickness inside the groove and on the silicon surface. In this example, polysilicon is deposited inside the groove and on the silicon surface using CVD or a sputter device, and the polysilicon formed on the surface is removed by etch-back to leave it only in the groove. The embedded electrode is thus formed. Since polysilicon is used as the electrode, the polysilicon deposited is saturated with phosphorus impurities in order to have low resistance.

(6) An oxide film and a nitride film are formed on the surface, and LOCOS oxidation is performed so as not to have a thick oxide film on the phototransistor region which hinders incidence of light. The remaining thick oxide film is used for device separation between the phototransistor region and the MOS region. Thereafter, through thermal oxidation, an oxide film of about 10 nm thickness is formed on the surface of the MOS region and the phototransistor region.

(7) Phosphorus (50 KeV $6 \times 10^{15}$ cm$^{-2}$) is implanted as an emitter region of the phototransistor region.

(8) Thereafter, a thermal treatment is performed under 920° C. for 30 minutes. It is desirable that the diffusion be shallow because the emitter region hinders light absorption.

(9) After that, an insulating oxide film is formed using CVD. Then, contact holes are formed in the emitter diffusion region to form metal wiring. Further, as a wire for the embedded electrode, the polysilicon is drawn out from a circumferential portion of the phototransistor region. Further, since the metal wiring shields light, it should desirably be arranged on the embedded electrode as much as possible.

Figure 5A:
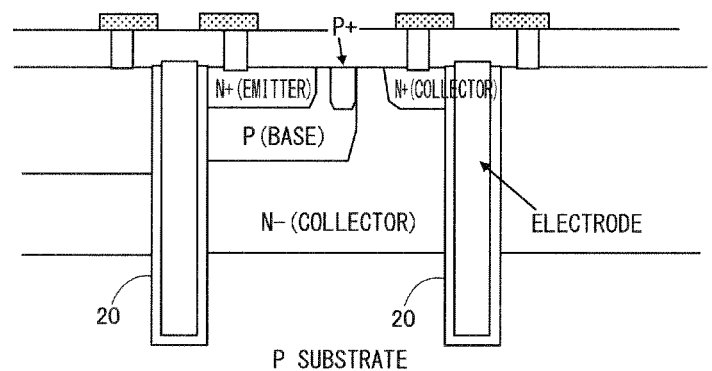
FIGS. 5A and 5B show yet another example of a phototransistor according to the present invention, FIG. 5A showing its sectional view, FIG. 5B showing its plan view.
Figure 5B:
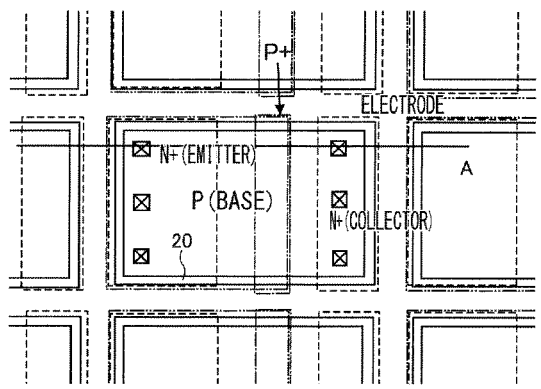

FIGS. 8A and 8B are diagrams illustrating an example of a method of manufacturing the isolated-collector phototransistor shown in FIGS. 5A and 5B.

(1) In this example, a P-type silicon (20 Ωcm) substrate is used.

(2) A p-well region and an n-well regions are formed through the same flow as in FIG. 7A.

(3) Phosphorus (150 KeV $10^{12}$ cm$^{-2}$) is implanted to a collector region to be. A thermal treatment is performed under 1150° C. for 240 minutes to form a collector diffusion region of about 6 μm depth.

(4) To isolate the collector, a groove of about 10 μm depth is formed by silicon etching, the groove extending beyond the collector diffusion region in its depth direction and reaching the silicon substrate.

(5) Thermal oxidation is performed to form an oxide film of about 20 nm thickness. Then, polysilicon doped with phosphorus impurities is deposited using CVD, a sputter device, or the like, and is left only in the groove by etch-back. Thus, an embedded electrode is formed.

(6) An oxide film and a nitride film are formed on the surface, and LOCOS oxidation is performed so as not to have a thick oxide film. The oxide film is also used for device isolation of the MOS region.

(7) Boron (50 KeV $5 \times 10^{13}$ cm$^{-2}$) is implanted for a base region.

(8) A thermal treatment is performed under 1120° C. for 90 minutes to form a base region inside the collector region. To have a collector electrode on the surface, the collector region has an area with no base region.

(9) Phosphorus (50 KeV $6 \times 10^{15}$ cm$^{-2}$) is implanted as an emitter region. Simultaneously, the phosphorus is implanted away from the base region and the emitter region, as ohmic diffusion in the collector region.

(10) Since the collector electrode is provided on the surface side, the phototransistor has a lateral bipolar transistor structure. A P+ region of 1.5 μm width is formed by implanting boron (25 KeV $3 \times 10^{15}$ cm$^{-2}$) between the emitter region and the collector ohmic region at a position 1 μm away from the emitter region to increase the base diffusion concentration on the surface side. Thereby, behavior as a lateral bipolar transistor is suppressed.

(11) A thermal treatment is performed under 920° C. for 30 minutes for impurity activation. It is desirable that the diffusion be shallow because the emitter region hinders light absorption.

(12) After that, an insulating oxide film is formed using CVD. Then, contact holes are formed in the emitter impurity diffusion region and the collector ohmic impurity diffusion region to form metal wiring. Further, as a wire for the embedded electrode, the polysilicon is drawn out from the periphery of the phototransistor region. Further, since the metal wiring shields light, it should desirably be arranged along the embedded electrode.

Figure 6A:
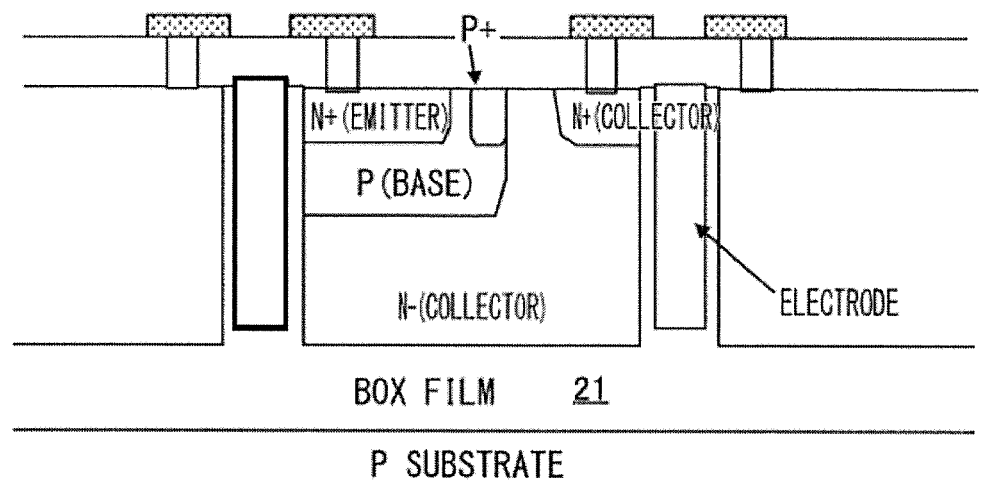
FIGS. 6A and 6B show still another example of a phototransistor according to the present invention, FIG. 6A showing its sectional view, FIG. 6B showing its plan view.
Figure 6B:
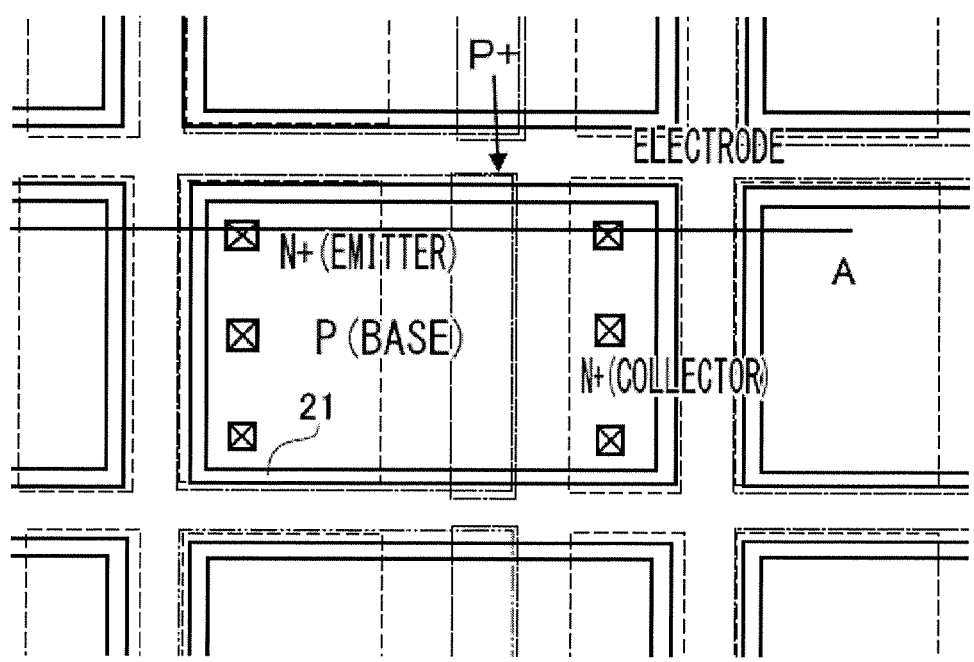

FIGS. 9A and 9B are diagrams illustrating an example of a method of manufacturing the phototransistor using an SOI substrate as shown in FIGS. 6A and 6B.

(1) An SOI substrate is prepared by forming a BOX film of 1 μm thickness on a silicon substrate and forming a P-type (20 Ωcm) silicon active layer of 10 μm thickness on the BOX film.

The steps (2) to (12) are the same as those in FIGS. 8A and 8B, except for Step (4) in which the groove is formed by silicon etching to reach the BOX film, and are therefore not repeatedly described.

The present invention is industrially very useful because it provides a semiconductor device having a small sized cell and improved light use efficiency and also provides an imaging apparatus using the semiconductor device.

In particular, a semiconductor device having a vertical bipolar transistor structure in which an emitter region, a base region, and a collector region are formed in this order from a surface of a semiconductor substrate in a depth direction, the semiconductor device further includes: an electrode embedded from the surface of the semiconductor substrate into an inside of the semiconductor substrate, and insulated by an oxide film, wherein in the surface of the substrate, the semiconductor device has a structure in which a first semiconductor region of a first conductivity type, a second semiconductor region of a second conductivity type with a first (upper) surface, a second (lower) surface, and a side surface, and a third semiconductor region of the first conductivity type are arranged, from the surface side, inside a semiconductor device region surrounded by the electrode and along the electrode being opposed via the oxide film interposed therebetween to the side surface of the second semiconductor region, the second semiconductor region being located below the first semiconductor region, the third semiconductor region being located below the second semiconductor region, the electrode is insulated from the first semiconductor region, the second semiconductor region, and the third semiconductor region by the oxide film, and a current gain is variable through application of voltage to the electrode.

A semiconductor device having a vertical bipolar transistor structure in which an emitter region, a base region, and a collector region are formed in this order from a surface of a semiconductor substrate in a depth direction, the semiconductor device further includes: an electrode embedded from the surface of the semiconductor substrate into an inside of the semiconductor substrate, and insulated by an oxide film, wherein in the surface of the substrate, the semiconductor device has a structure in which a first semiconductor region of a first conductivity type, a second semiconductor region of a second conductivity type with a first (upper) surface, a second (lower) surface, and a side surface, and a third semiconductor region of the first conductivity type are arranged, from the surface side, inside a semiconductor device region surrounded by the electrode and along the electrode being opposed via the oxide film interposed therebetween to the side surface of the second semiconductor region, the second semiconductor region being located below the first semiconductor region, the third semiconductor region being located below the second semiconductor region, an impurity distribution profile of the second semiconductor region is oblique such that an impurity concentration of the second semiconductor region is lower on the third semiconductor region side than on the first semiconductor region side, the electrode is insulated from the first semiconductor region, the second semiconductor region, and the third semiconductor region by the oxide film, and a current gain is variable through application of voltage to the electrode.

The first semiconductor region on the surface side is spaced apart from the electrode, and a part of the second semiconductor region is located in the surface and interposes between the first semiconductor region and the electrode.

A semiconductor device having a vertical bipolar transistor structure in which an emitter region, a base region, and a collector region are formed in this order from a surface of a semiconductor substrate in a depth direction, the semiconductor device further includes: an electrode embedded from the surface of the semiconductor substrate into an inside of the semiconductor substrate, and insulated by an oxide film, wherein in the surface of the substrate, the semiconductor device has a structure in which a first semiconductor region of a first conductivity type, a second semiconductor region of a second conductivity type with a first (upper) surface, a second (lower) surface, and a side surface, a third semiconductor region of the first conductivity type, and a fourth semiconductor region of the second conductivity type are arranged, from the surface side, inside a semiconductor device region surrounded by the electrode and along the electrode being opposed via the oxide film interposed therebetween to the side surface of the second semiconductor region, the second semiconductor region being located below the first semiconductor region, the third semiconductor region being located below the second semiconductor region, the fourth semiconductor region being located below the third semiconductor region, the electrode is insulated from the first semiconductor region, the second semiconductor region, the third semiconductor region, and the fourth semiconductor region by the oxide film, and a current gain is variable through application of voltage to the electrode.

A semiconductor device having a vertical bipolar transistor structure in which an emitter region, a base region, and a collector region are formed in this order from a surface of a semiconductor substrate in a depth direction, the semiconductor device further includes: an electrode embedded from the surface of the semiconductor substrate, which is an SOI (Silicon On Insulator) substrate, into an inside of the semiconductor substrate, and insulated by an oxide film, wherein in the surface of the substrate, the semiconductor device has a structure in which a first semiconductor region of a first conductivity type, a second semiconductor region of a second conductivity type with a first (upper) surface, a second (lower) surface, and a side surface, and a third semiconductor region of the first conductivity type, from the surface side, inside a semiconductor device region surrounded by the electrode and along the electrode being opposed via the oxide film interposed therebetween to the side surface of the second semiconductor region, the second semiconductor region being located below the first semiconductor region, the third semiconductor region being located below the second semiconductor region, the structure having a BOX (Buried Oxide) film formed below the third semiconductor region and in contact with the oxide film, the electrode is insulated from the first semiconductor region, the second semiconductor region, and the third semiconductor region by the oxide film, and a current gain is variable through application of voltage to the electrode.

An imaging apparatus includes the above semiconductor device, wherein the semiconductor device operates as a phototransistor, and a plurality of the semiconductor devices are two-dimensionally arranged.

The imaging apparatus further includes a comparator circuit configured to monitor a photocurrent outputted by light irradiation or a voltage obtained by converting the photocurrent, and to control, based on a result of the monitoring, voltage applied to the electrode.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A phototransistor having a vertical bipolar transistor structure in which an emitter region, a base region, and a collector region are formed in this order from a surface of a semiconductor substrate in a depth direction,
   the phototransistor further comprising an electrode embedded from the surface of the semiconductor substrate into an inside of the semiconductor substrate, and insulated by an oxide film, wherein
   in the surface of the substrate, the phototransistor has a structure in which a first semiconductor region of a first conductivity type, a second semiconductor region of a second conductivity type, and a third semiconductor region of the first conductivity type are arranged, from the surface side, inside a phototransistor region surrounded by the embedded electrode and along the embedded electrode with the oxide film interposed therebetween, the second semiconductor region being located below the first semiconductor region and having a side surface, the third semiconductor region being located below the second semiconductor region, said embedded electrode being opposed via the oxide film to said side surface of said second semiconductor region,
   the embedded electrode is insulated from the first semiconductor region, the second semiconductor region, and the third semiconductor region by the oxide film, and
   by application of voltage to the embedded electrode, a current gain applied to a photocurrent generated by the phototransistor as a result of light irradiation is variable in a current gain varying region adjacent to the embedded electrode.

2. The phototransistor according to claim 1, wherein an impurity distribution profile of the second semiconductor region is oblique such that an impurity concentration of the second semiconductor region is lower on the third semiconductor region side than on the first semiconductor region side.

3. The phototransistor according to claim 2, wherein
   the first semiconductor region on the surface side is spaced apart from the embedded electrode, and
   a part of the second semiconductor region is located in the surface and interposed between the first semiconductor region and the embedded electrode.

4. An imaging apparatus comprising the phototransistor according to claim 2, wherein a plurality of the phototransistors are two-dimensionally arranged.

5. The imaging apparatus according to claim 4, further comprising a comparator circuit configured to monitor a photocurrent outputted by light irradiation or a voltage obtained by converting the photocurrent, and to control, based on a result of the monitoring, voltage applied to the embedded electrode.

6. The phototransistor according to claim 1, wherein
   the first semiconductor region on the surface side is spaced apart from the embedded electrode, and
   a part of the second semiconductor region is located in the surface and interposed between the first semiconductor region and the embedded electrode.

7. An imaging apparatus comprising the phototransistor according to claim 6, wherein a plurality of the phototransistors are two-dimensionally arranged.

8. The imaging apparatus according to claim 7, further comprising a comparator circuit configured to monitor a photocurrent outputted by light irradiation or a voltage obtained by converting the photocurrent, and to control, based on a result of the monitoring, voltage applied to the embedded electrode.

9. The phototransistor according to claim 1, wherein below the third semiconductor region, a fourth semiconductor region of the second conductivity type is arranged, and the embedded electrode is further insulated from the fourth semiconductor region.

10. An imaging apparatus comprising the phototransistor according to claim 9, wherein a plurality of the phototransistors are two-dimensionally arranged.

11. The imaging apparatus according to claim 10, further comprising a comparator circuit configured to monitor a photocurrent outputted by light irradiation or a voltage obtained by converting the photocurrent, and to control, based on a result of the monitoring, voltage applied to the embedded electrode.

12. The phototransistor according to claim 1, wherein an SOI substrate is used as the semiconductor substrate, and below the third semiconductor region, a BOX film in contact with the oxide film is arranged.

13. An imaging apparatus comprising the semiconductor device according to claim 12, wherein a plurality of the phototransistors are two-dimensionally arranged.

14. The imaging apparatus according to claim 13, further comprising a comparator circuit configured to monitor a photocurrent outputted by light irradiation or a voltage obtained by converting the photocurrent, and to control, based on a result of the monitoring, voltage applied to the embedded electrode.

15. An imaging apparatus comprising the phototransistor according to claim 1, wherein a plurality of the phototransistors are two-dimensionally arranged.

16. The imaging apparatus according to claim 15, further comprising a comparator circuit configured to monitor a photocurrent outputted by light irradiation or a voltage obtained by converting the photocurrent, and to control, based on a result of the monitoring, voltage applied to the embedded electrode.

17. The phototransistor according to claim 1, wherein the first semiconductor region of the first conductivity type, the second semiconductor region of the second conductivity type, and the third semiconductor region of the first conductivity type are arranged as the emitter region, the base region and the collector region, respectively, of the phototransistor.

18. The phototransistor according to claim 1, wherein a width of the second semiconductor region is variable through application of voltage to the current gain varying region adjacent to the embedded electrode.

19. A method of controlling gain of a phototransistor which comprises:

a first semiconductor region of a first conductivity type as an emitter region, a second semiconductor region of a second conductivity type as a base region, and a third semiconductor region of the first conductivity type as a collector region arranged in this order from a surface of a semiconductor substrate in a depth direction, surrounded by an electrode with an oxide film interposing the electrode therebetween, said second semiconductor region being located below the first semiconductor region and having a side surface, said electrode being opposed via the oxide film to said side surface of said second semiconductor region and being insulated from the first semiconductor region, the second semiconductor region, and the third semiconductor region by the oxide film, wherein the gain of the phototransistor is varied by varying the voltage applied to the gate.

20. The method of controlling gain of a phototransistor according to claim 19, further comprising making an impurity distribution profile of the second semiconductor region oblique such that an impurity concentration of the second semiconductor region is lower on the third semiconductor region side than on the first semiconductor region side.

* * * * *